United States Patent

Mindl et al.

[11] Patent Number: 5,841,312
[45] Date of Patent: Nov. 24, 1998

[54] GATING CIRCUIT HAVING CURRENT MEASURING AND REGULATING ELEMENTS AND A TEMPERATURE MEASURING TRANSISTOR

[75] Inventors: Anton Mindl, Hildesheim; Hartmut Michel, Reutlingen; Bernd Bireckoven, Kusterdingen; Manfred Uebele, Reutlingen; Ulrich Nelle, Sonnenbuehl, all of Germany

[73] Assignee: Robert Bosch GmbH, Stuttgart, Germany

[21] Appl. No.: 669,342
[22] PCT Filed: Jan. 14, 1995
[86] PCT No.: PCT/DE95/00039
    § 371 Date: Jul. 1, 1996
    § 102(e) Date: Jul. 1, 1996
[87] PCT Pub. No.: WO95/20783
    PCT Pub. Date: Aug. 3, 1995

[30] Foreign Application Priority Data

Jan. 27, 1994 [DE] Germany .......................... 44 02 340.5

[51] Int. Cl.[6] .................................................. H03K 17/14
[52] U.S. Cl. .......................... 327/378; 327/108; 327/491; 327/513; 323/285; 361/87
[58] Field of Search .......................... 327/108–112, 378, 327/379, 387, 482, 483, 489, 491, 513; 361/81, 86, 87, 93, 103; 323/284, 285

[56] References Cited

U.S. PATENT DOCUMENTS

| 5,008,586 | 4/1991 | Miyazaki et al. | 323/315 |
| 5,281,872 | 1/1994 | Mori | 327/362 |
| 5,406,130 | 4/1995 | Hennig | 327/108 |
| 5,486,781 | 1/1996 | Im | 327/108 |

OTHER PUBLICATIONS

Tietze & Schenk pp. 522–525 1974.

Primary Examiner—Timothy P. Callahan
Assistant Examiner—Kenneth B. Wells
Attorney, Agent, or Firm—Michael J. Striker

[57] ABSTRACT

The gating circuit has a power transistor (T1, T2, T3) and a current measuring resistor (R5) connected with the power transistor so that a voltage drop at the measuring resistor is a measure of a current flow in the power transistor. This voltage drop is used to trigger a current regulating transistor (T5) and a temperature measuring transistor (T9). Below a predetermined temperature, the current flow is limited solely by the current regulating transistor (T5). Above this predetermined temperature the collector current is further reduced via the temperature measuring transistor (T9) and a further transistor (T10) so as to protect the power transistor from thermal overload.

9 Claims, 2 Drawing Sheets

GATING CIRCUIT HAVING CURRENT MEASURING AND REGULATING ELEMENTS AND A TEMPERATURE MEASURING TRANSISTOR

BACKGROUND OF THE INVENTION

The present invention relates to a gating circuit having a current measuring resistor and a power transistor and, more particularly, to a gating circuit of this type in which the current flowing through the power transistor is measurable by pickup of the voltage drop at the current measuring resistor and which has a current regulating transistor whose collector is connected to the base via a resistor and whose emitter is connected to the emitter of the power transistor so that the base of the power transistor is triggered by the voltage drop at the current measuring resistor.

SUMMARY

It is an object of the invention to provide an improved gating circuit of the above-described type, in which current flow through the power transistor is reduced as a function of component temperature.

This object and others which will be made more apparent hereinafter is attained in a gating circuit having a current measuring resistor and a power transistor, in which the current flowing through the power transistor is measurable by pickup of the voltage drop at the current measuring resistor and which has a current regulating transistor whose collector is connected to the base via a resistor and whose emitter is connected to the emitter of the power transistor so that the base of the power transistor is triggered by the voltage drop at the current measuring resistor.

According to the invention, the gating circuit is provided with a temperature measuring transistor, a further transistor which is triggered by the temperature measuring resistor when the temperature exceeds a predetermined temperature and means for varying a voltage applied to the base of the current regulating transistor by means of the current flowing through the further transistor so that the current flow through the power transistor is reduced.

The integrated circuit according to the invention has the advantage over the prior art that the current flow through the power transistor is reduced as a function of the component temperature. This provision provides protection of the power transistor against overheating.

By means of the provisions recited in the dependent claims, advantageous further features of and improvements to the integrated circuit defined by the independent claim are possible. By the use of a temperature measuring transistor with a larger emitter surface area than the current regulating transistor, the temperature dependency of the circuit can be controlled especially exactly. By the use of a current measuring transistor connected parallel to the power transistor, the current measurement is effected with low losses, since no measuring resistor needs to be disposed in the emitter circuit. By the use of a voltage divider, the switching potential for the current regulating transistor and the temperature measuring transistor can be adjusted to a suitable level. By the use of diodes connected in the conducting direction, the positive temperature coefficient of the current regulation can be adjusted to the desired value. By the suitable dimensioning of a coupling resistor, the magnitude of the thermal cutoff is adjusted. Varying the potential through the current flow of the further transistor is done especially simply via a third node of the voltage divider. By using Darlington transistors or additional current regulating transistors, the corresponding gains can be increased.

BRIEF DESCRIPTION OF THE DRAWING

Exemplary embodiments of the invention are shown in the drawings and described in further detail in the ensuing description.

DESCRIPTION OF THE PREFERRED EMBODIMENT

Figure 1:
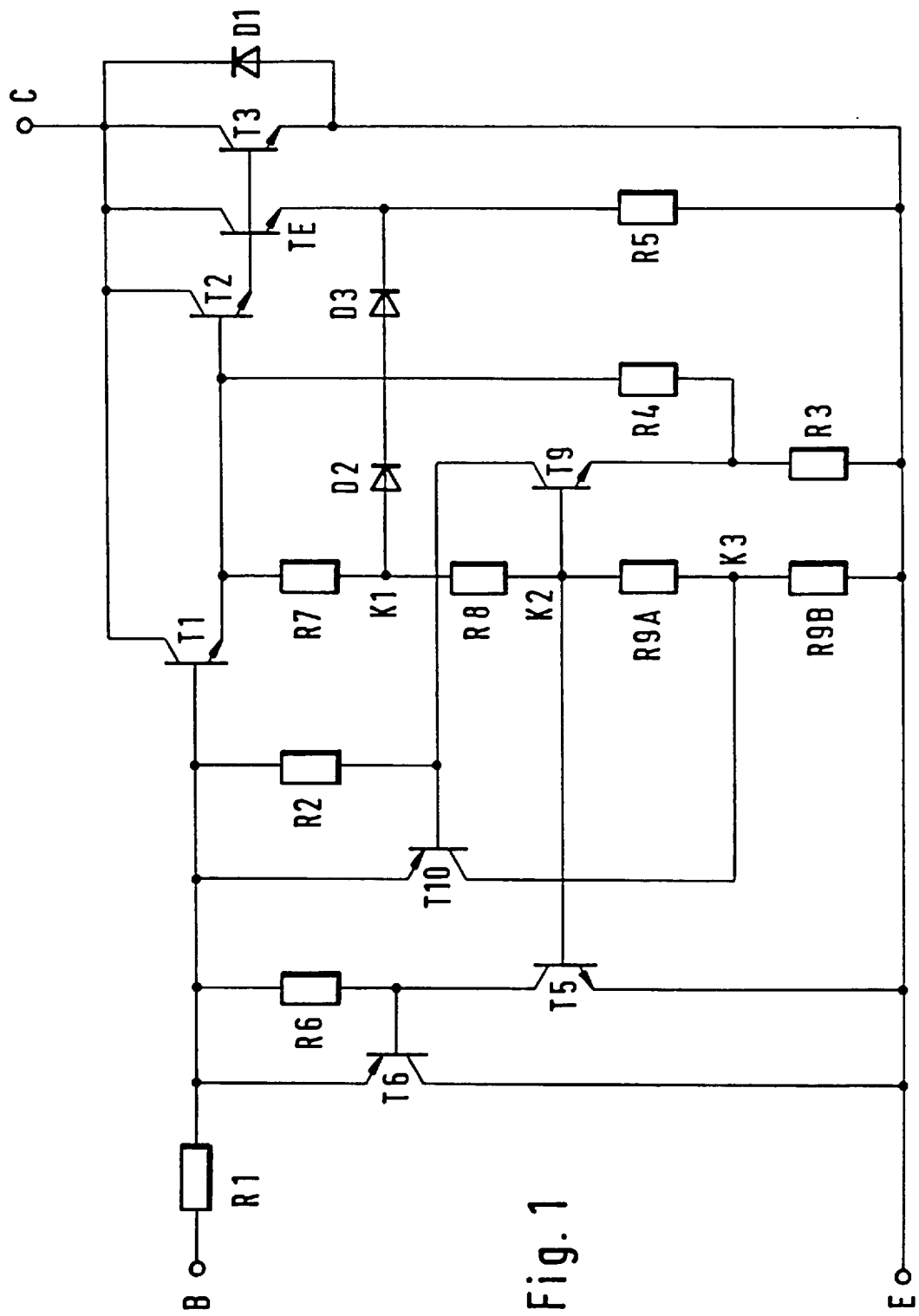
FIG. 1 is a circuit diagram of the integrated gating circuit.

In FIG. 1, a circuit diagram of the integrated gating circuit is shown. The circuit has a collector terminal C, a base terminal B, an emitter terminal E, and transistors T1, T2, T3, TE, T5, T6, T9 and T10. The transistors T1, T2, TE, T3, T9, T5 are embodied as npn transistors. The transistors T10 and T6 are embodied as pnp transistors. It is self-evident that corresponding npn and pnp transistors can be transposed by suitably changing the applied potentials. The transistors T1, T2, T3 operate as a Darlington Circuit, although this is not a necessary precondition for the fundamental function of the circuit presented. The base terminal B is connected to the base terminal of the first transistor T1 via a resistor R1. The collector of the transistor T1 is connected to the collector terminal C. The emitter of the transistor T1 is connected to the base of the transistor T2. The collector of the transistor T2 is connected to the collector terminal. The emitter of the collector T2 is connected to the base of the current measuring transistor TE and the transistor T3. The collectors of the current measuring transistor TE and of the transistor T3 are connected to the collector terminal. The emitter of the current measuring transistor TE is connected to the emitter terminal E via a resistor R5. The emitter of the transistor T3 is connected to the emitter terminal. The emitter terminal E is connected to the anode of a diode D1. The collector terminal is connected to the cathode of the diode D1. The emitter of the transistor T6 is connected to the base of the transistor T1. The collector of the transistor T6 is connected to the emitter terminal. The base of the transistor T6 is connected to the base of the transistor T1 via a resistor R6. The base of the transistor T6 is connected to the collector of the transistor T5. The emitter of the transistor T5 is connected to the emitter terminal E. The base of the transistor T5 is connected to the node K2 of a voltage divider (formed by R7, R8, R9A and R9B). The emitter of the transistor T10 is connected to the base of the transistor T1. The collector of the transistor T10 is connected to the node K3 of the aforementioned voltage divider. The base of the transistor T10 is connected to the base of the transistor T1 via a resistor R2. A transistor T9 is connected by its collector to the base of the transistor T10. The base of the transistor T9 is connected to the node K2. The emitter of the transistor T9 is connected to the emitter terminal E via a resistor R3. The voltage divider is formed by resistors R7, R8, R9A and R9B. The resistor R7 is disposed between the emitter of the transistor T1 and a node K1. The resistor R8 is disposed between the node K1 and the node K2. The resistor R9A is disposed between the node K2 and the node K3. The resistor R9B is disposed between the node K3 and the emitter terminal E. The node K1 is connected to the anode of a diode D2. The cathode of the diode D2 is connected to the anode of a diode D3. The cathode of the diode D3 is connected to the emitter of the current measuring transistor TE. The emitter of the transistor T1 is connected to the emitter of the temperature measuring transistor T9 via a coupling resistor R4.

The Darlington transistors T1, T2, T3 form a power transistor, with which a load can be switched appropriately between a collector and an emitter. The current measuring transistor TE is connected parallel to the last transistor T3. Flowing through this transistor TE is a current that is unequivocally dependent on the current flow through the transistor T3. This current generates a voltage drop at the resistor R5. Since only a slight current flows through the parallel-connected current measuring transistor TE, the power loss is kept slight. A voltage divider is formed by the resistors R7, R8, R9A and R9B. By connecting the node K1 of this voltage divider to emitter of the current measuring transistor TE, the voltage at the node K2 of the voltage divider is raised when the current through the transistor TE is rising. The base of the current regulating transistor T5 and the base of the temperature measuring transistor T9 are connected to the node K2. The transistor T9 has a substantially larger emitter surface area than the transistor T5. The resistor R2 also has a higher resistance than R6. Because of the low current density in T9 by comparison with T5, T9 has a lower base-to-emitter voltage than T5. Moreover, the negative temperature coefficient of the base-to-emitter voltage of the temperature measuring transistor T9 is substantially greater than that of the transistor T5. Below a predetermined temperature, the effect of the voltage drop at the resistor R3 is that the voltage drop at the resistor R5 acts only upon the current regulating transistor T5. When the intended regulating surface through the power transistor T1, T2, T3 is reached, the current regulating transistor T5 is opened, which diverts a portion of the base current directly to the emitter terminal. For amplification, a further current regulating transistor T6 is also provided here, which is opened by the current flow through the transistor T5. In principle, however, the circuit also functions without the transistor T6. Above a predetermined temperature, the temperature measuring transistor T9 is then activated as well. Via the resistors R2 and R3, a further current flow between the base terminal B and the emitter terminal E is then made possible. In this current flow, a potential that opens the transistor T10 is established at the base terminal of T10. Since the collector of the transistor T10 is connected to the node K3 of the voltage divider, the potential at the node K3 or at the node K2 is raised by the current flow through T10. Because of this feedback, the voltage at the node K2 is thus affected in such a way that the transistor T5 is further opened, thereby reducing the current flow between the collector and the emitter through the power transistor T1, T2, T3. A further reduction in the current flow through the power transistor T1, T2, T3 after activation of T10 is caused by the resistor R4. By the onset of thermal cutoff, the potential at the base of the transistor T2 is reduced. Via the coupling resistor R4, this leads to a reduction in the potential at the emitter of the temperature measuring transistor T9. This leads to a further opening of T9, which causes a lowering of the current through the power transistor. That is, once the temperature measuring transistor T9 has been opened a first time, and as long as the current flow through the power transistor is not stopped by other provisions, the thermally dictated cutoff of the collector-to-emitter current of the power transistor T1, T2, T3 continues to be maintained.

The onset of the thermal cutoff is determined by the ratio of thermally synchronized resistors, by the surface areas of the transistors T5, T6, T9, T10, and by the base-to-emitter voltage $U_{BE}$ (T2,T3) of the transistors T2 and T3. The base-to-emitter voltage $U_{BE}$ (T9) of the transistor T9, because of the larger emitter surface area of the transistor T9, is substantially more strongly dependent on the temperature than is the base-to-emitter voltage $U_{BE}$ (T5) of the transistor T5. The transistor T10 becomes conducting when the following equation is true:

$$U_{BE}(T5)=U_{BE}(T9)+R4/(R3+R4)[R3/R2 U_{BE}(T10)+R3/R4 U_{BE}(T2,T3)]$$

The base-to-emitter voltage of the power transistor T2, T3 has the greatest range of deviation. Since this magnitude enters only into the very low resistance ratio R3/R4, however, the onset temperature of the thermal cutoff involves only very slight tolerances. Testing of the circuit can be done even below the intended response temperature by externally decreasing R3.

Figure 2:
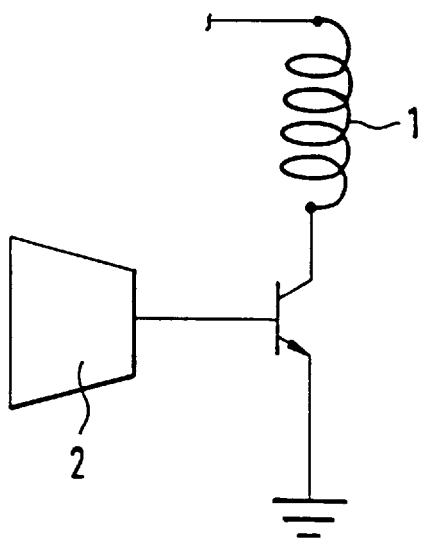
FIG. 2 shows the integrated circuit in combination with an inductive load.
Figure 3:
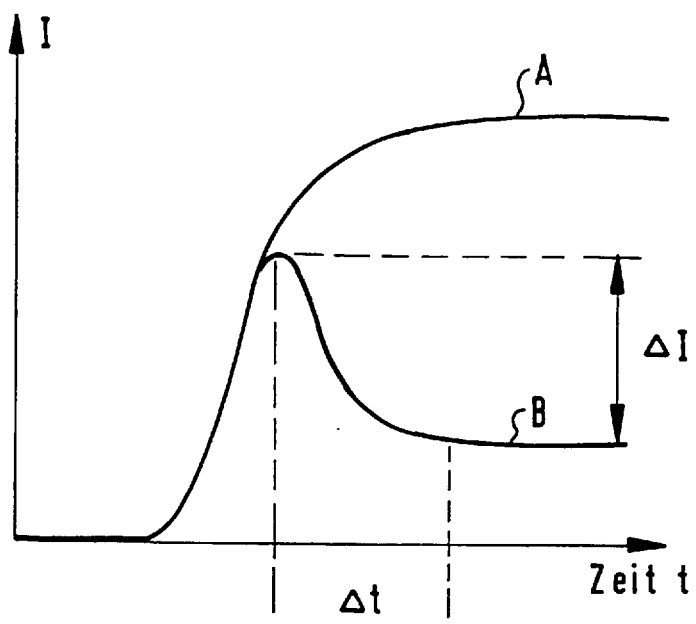
FIG. 3 is a graph showing the course over time of the current through the integrated circuit.

In FIG. 2, an application of the circuit of the invention for switching an inductive load is shown. The inductive load, represented by the coil 1, may for instance be an ignition coil, which can be connected to a ground potential by means of the circuit, here shown in simplified form as a transistor. The triggering of the circuit is done for instance by means of a controller 2. In FIG. 3, the collector current I is shown as a function of time for the arrangement of FIG. 2. The curve A shows the course over time of the collector current if only the current limitation by the current limiting transistor T5 and the transistor T6 is operative. Curve B describes the course over time of the collector current if in addition the thermal control by the temperature measuring transistor T9 intervenes. The difference ΔI, that is, the lowering of the current level after response by the circuit, depends essentially on the dimensioning of the resistor R4. The time Δt may be varied within certain limits by suitable placement of the temperature measuring transistor T9 and of the current regulating transistor T5 relative to the end stage T3.

The circuit shown is especially suitable for wiring to an inductive load, such as an ignition coil; this is shown in FIG. 2. By means of a suitable signal of the controller 2, the transistor is opened, and thus the coil 1 is disposed between the collector-to-emitter potential of the transistor in the conducting state and a supply voltage. Because of the inductance, when the coil 1 is charged the current through the coil and the transistor will rise slowly. In that phase, the Darlington transistor operates at saturation, and because of the low collector-to-emitter voltage no high power loss occurs. In the normal operating mode of the ignition, the transistor is meant to be shut off by the controller 2 before the current flow through the coil and the transistor becomes constant over time, because otherwise the transistor would have to take on most of the supply voltage, and high power losses would have to be dissipated. If the shutoff signal fails because of a malfunction, however, and the current flow through the transistor persists, then the resultant heating activates the thermal cutoff, which reduces the current flow through the transistor to unproblematic values. Since this cutoff is effected continuously, the appearance of steep voltage rises between the collector and emitter, which can cause unintended ignition sparks, can be avoided. The thermal cutoff also ensues only if a high current flows through the circuit at a high temperature. If the current flow is limited by the inductance of the coil, then as discussed above a high power loss does not occur in the transistor— and hence there is no significant temperature rise, and thus the thermal cutoff is not activated. When the circuit functions in ignition applications in which although the temperature is high yet the current flowing through the circuit is limited by the inductance rather than by the current control of the circuit presented, the ignition coil can thus still be correctly charged, so that even at a high temperature, under normal operating conditions unimpeded function of the circuit is assured.

The diode D1 functions as a negative-sequenced diode, by limiting negative collector-to-emitter voltages to slight values, in order for instance in ignition applications to damp the high-frequency oscillations transformed back from the secondary side of the ignition coil.

The diodes D2 and D3 are connected in the flow direction during normal operation of the circuit. A voltage that has a negative temperature coefficient therefore drops at these diodes. This negative temperature coefficient is utilized in order to adjust the temperature coefficient of the current regulation to the desired value. The temperature behavior of the circuit is thus defined primarily by the thermal properties of the temperature measuring transistor T9. It is thus possible to set the response temperature of the thermal current regulation exactly.

We claim:

1. An integrated circuit comprising a power transistor (T1, T2, T3) having a base and an emitter;

a current measuring resistor (R5) connected to the power transistor (T1, T2, T3) so that a voltage drop at the current measuring resistor (R5) is a measure of a current flowing through the power transistor (T1, T2, T3);

a current regulating transistor (T5) having a base, a collector and an emitter, wherein said collector of the current regulating transistor (T5) is connected to the base of the power transistor via a resistor (R6) and the emitter of the current regulating transistor (T5) is connected to the emitter of the power transistor (T1, T2, T3);

means for triggering the current regulating transistor (T5) with the voltage drop at the current measuring resistor (R5);

a temperature measuring transistor (T9) having a base, a collector and an emitter and a further transistor (T10) connected with the temperature measuring transistor (T9) so that the further transistor (T10) is triggered by the temperature measuring transistor (T9) and a current flows through the further transistor (10) when a predetermined temperature is exceeded; and means for varying a voltage applied to the base of the current regulating transistor (T5) by means of the current flowing through the further transistor (T10) in such a way that the current flow through the power transistor (T1, T2, T3) is reduced when the predetermined temperature is exceeded.

2. The integrated circuit as defined in claim 1, wherein the emitter of the temperature measuring transistor (T9) has a larger emitter surface area than that of the emitter of the current regulating transistor (T5), the base of the current regulating transistor (T5) and the base of the temperature measuring transistor (T9) are connected so as to be at the same potential and the emitter of the temperature measuring transistor (T9) is connected via a resistor (R3) to the emitter of the power transistor (T1, T2, T3).

3. The integrated circuit as defined in claim 2, wherein said means for triggering the current regulating transistor (T5) comprises a current measuring transistor (TE) having an emitter, and wherein the current measuring transistor (TE) is connected in parallel to the power transistor (T1, T2, T3) and the emitter of the current measuring transistor (TE) is connected to the emitter of the power transistor (T1, T2, T3) via the current measuring resistor (R5).

4. The integrated circuit as defined in claim 3, wherein the means for varying the voltage applied to the base of the current regulating transistor (T5) when the predetermined temperature is exceeded comprises a voltage divider consisting of a plurality of voltage divider resistors (R7, R8, R9A, R9B) connected in series with each other with respective nodes (K1, K2, K3) between adjacent ones of the voltage divider resistors, and wherein one (K1) of the nodes is connected to the emitter of the current measuring transistor (TE) and another (K2) of the nodes is connected to the base of the current regulating transistor (T5) and to the base of the temperature measuring transistor (T9).

5. The integrated circuit as defined in claim 4, further comprising at least one diode (D2,D3) having an anode and said at least one diode (D2,D3) is connected between said one (K1) of said nodes and the emitter of the current measuring transistor (TE) with said anode connected to said one of said nodes.

6. The integrated circuit as defined in claim 5, further comprising a coupling resistor (R4) connecting the emitter of the temperature measuring transistor (T9) to the base of the power transistor (T1, T2, T3).

7. The integrated circuit as defined in claim 6, wherein a third one (K3) of said nodes of said voltage divider is connected to a collector of the further transistor (T10).

8. The integrated circuit as defined in claim 1, wherein said power transistor (T1, T2, T3) is a Darlington transistor.

9. The integrated circuit as defined in claim 3, further comprising an additional current regulating transistor (T6) and means for opening said additional current regulating transistor (T6) including said current regulating transistor (T5).

* * * * *